United States Patent
Shimano et al.

(10) Patent No.: US 9,065,443 B2
(45) Date of Patent: Jun. 23, 2015

(54) INVERTER DRIVE DEVICE

(75) Inventors: Hiroki Shimano, Hitachinaka (JP); Koichi Yahata, Hitachinaka (JP); Yoshio Akaishi, Hitachinaka (JP); Yasuo Noto, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 37 days.

(21) Appl. No.: 14/119,091

(22) PCT Filed: May 21, 2012

(86) PCT No.: PCT/JP2012/062943
§ 371 (c)(1),
(2), (4) Date: Nov. 20, 2013

(87) PCT Pub. No.: WO2012/165196
PCT Pub. Date: Dec. 6, 2012

(65) Prior Publication Data
US 2014/0085762 A1    Mar. 27, 2014

(30) Foreign Application Priority Data
May 31, 2011    (JP) .................................. 2011-121215

(51) Int. Cl.
| H02M 1/32 | (2007.01) |
| H03K 17/08 | (2006.01) |
| H02M 1/08 | (2006.01) |
| H02M 7/5387 | (2007.01) |

(52) U.S. Cl.
CPC ............... *H03K 17/08* (2013.01); *H02M 1/08* (2013.01); *H02M 1/32* (2013.01); *H02M 7/5387* (2013.01)

(58) Field of Classification Search
USPC ........................................................ 361/93.1
See application file for complete search history.

(56) References Cited

U.S. PATENT DOCUMENTS

| 4,680,664 | A | * | 7/1987 | Leuthen ........................ 361/91.3 |
| 4,890,009 | A | * | 12/1989 | Miyazaki et al. ............. 327/108 |
| 8,687,327 | B2 | * | 4/2014 | Watanabe et al. ............... 361/18 |
| 2005/0061306 | A1 | * | 3/2005 | Naruse et al. .................. 123/618 |
| 2005/0061307 | A1 | * | 3/2005 | Naruse et al. .................. 123/618 |

(Continued)

FOREIGN PATENT DOCUMENTS

| JP | 2007-28711 | A | | 2/2007 |
| JP | 2008-236907 | A | | 10/2008 |
| JP | 2009060358 | A | * | 3/2009 |

(Continued)

OTHER PUBLICATIONS

Corresponding International Search Report with English Translation dated Aug. 28, 2012 (three (3) pages).

*Primary Examiner* — Ronald W Leja
(74) *Attorney, Agent, or Firm* — Crowell & Moring LLP

(57) ABSTRACT

An inverter drive device includes a drive circuit that outputs a gate voltage signal of a power semiconductor element; and a Zener clamping protection circuit that acquires an emitter electrode side voltage of the power semiconductor element, and, if that voltage is greater than a predetermined voltage value, performs clamping of the gate voltage of the drive circuit after a predetermined time interval has elapsed from the acquisition of the emitter electrode side voltage. The Zener clamping protection circuit includes a latch circuit that, after the emitter electrode side voltage has been acquired, continues the clamping of the gate voltage by the Zener clamping protection circuit during an interval.

6 Claims, 11 Drawing Sheets

(56) References Cited

U.S. PATENT DOCUMENTS

2005/0194998 A1* 9/2005 Watanabe .................. 327/109
2014/0085762 A1* 3/2014 Shimano et al. ............ 361/91.6

FOREIGN PATENT DOCUMENTS

| JP | 2009-213305 A | 9/2009 |
| JP | 2010-154595 A | 7/2010 |

* cited by examiner

INVERTER DRIVE DEVICE

TECHNICAL FIELD

The present invention relates to an inverter drive device.

BACKGROUND ART

IGBTs are employed as power semiconductor elements that are used in high voltage inverters of hybrid electric vehicles (HEVs) and electric vehicles (EVs). With IGBTs, there is a tendency for the short circuiting toleration to be low as compared to MOSFETs, so that it is necessary to give consideration to design of short circuiting and over-current protection circuitry.

In the design of an inverter, in order to ensure security, it is possible to use IGBTs whose short circuiting toleration is high, but doing so has multiple demerits, such as increase of the cost, increase of steady loss, and so on. Moreover there is also a method of keeping down the short-circuiting current of an IGBT by clamping the gate voltage with a Zener diode when short circuiting occurs with the objective of reducing the energy during short circuiting, but there is a danger of the gate voltage oscillating, depending upon the type of the IGBT.

In Patent Document #1, it is disclosed to suppress over-current by clamping the gate voltage of an IGBT using a Zener diode when over-current is detected. However, with this method, there is a danger that the gate voltage may oscillate due to repetition of Zener clamping operation and Zener clamping cancellation operation. This phenomenon may become a cause for increase in voltage surging, and this is undesirable.

CITATION LIST

Patent Literature

Patent Document #1: Japanese Laid-Open Patent Publication 2008-236907.

SUMMARY OF INVENTION

Technical Problem

With the prior art method of clamping the gate voltage of an IGBT by using a Zener diode, there is a possibility that the gate voltage may oscillate.

Solution to Technical Problem

For solving the problem described above, an inverter drive device according to the present invention includes: a drive circuit that outputs a gate voltage of a power semiconductor element on the basis of a PWM signal; an over-current protection circuit that acquires an emitter electrode side voltage of the power semiconductor element, and, if that voltage is greater than a first predetermined voltage value that is determined in advance, outputs a fault signal to the drive circuit for stopping the output of the gate voltage after a first predetermined time interval has elapsed from the acquisition of the emitter electrode side voltage; and a Zener clamping protection circuit that acquires the emitter electrode side voltage of the power semiconductor element, and, if that voltage is greater than a second predetermined voltage value that is determined in advance, clamps the gate voltage signal of the drive circuit after a second predetermined time interval has elapsed from the acquisition of the emitter electrode side voltage, and the Zener clamping protection circuit includes a latch circuit that, after the emitter electrode side voltage has been acquired, continues the clamping of the gate voltage by the Zener clamping protection circuit during a predetermined time interval.

Advantageous Effects of Invention

According to the present invention, it is possible to enhance the security of an inverter system.

DESCRIPTION OF EMBODIMENTS

In the following, embodiments of the inverter drive device according to the present invention will be explained with reference to FIGS. 1 through 11.

Figure 1:
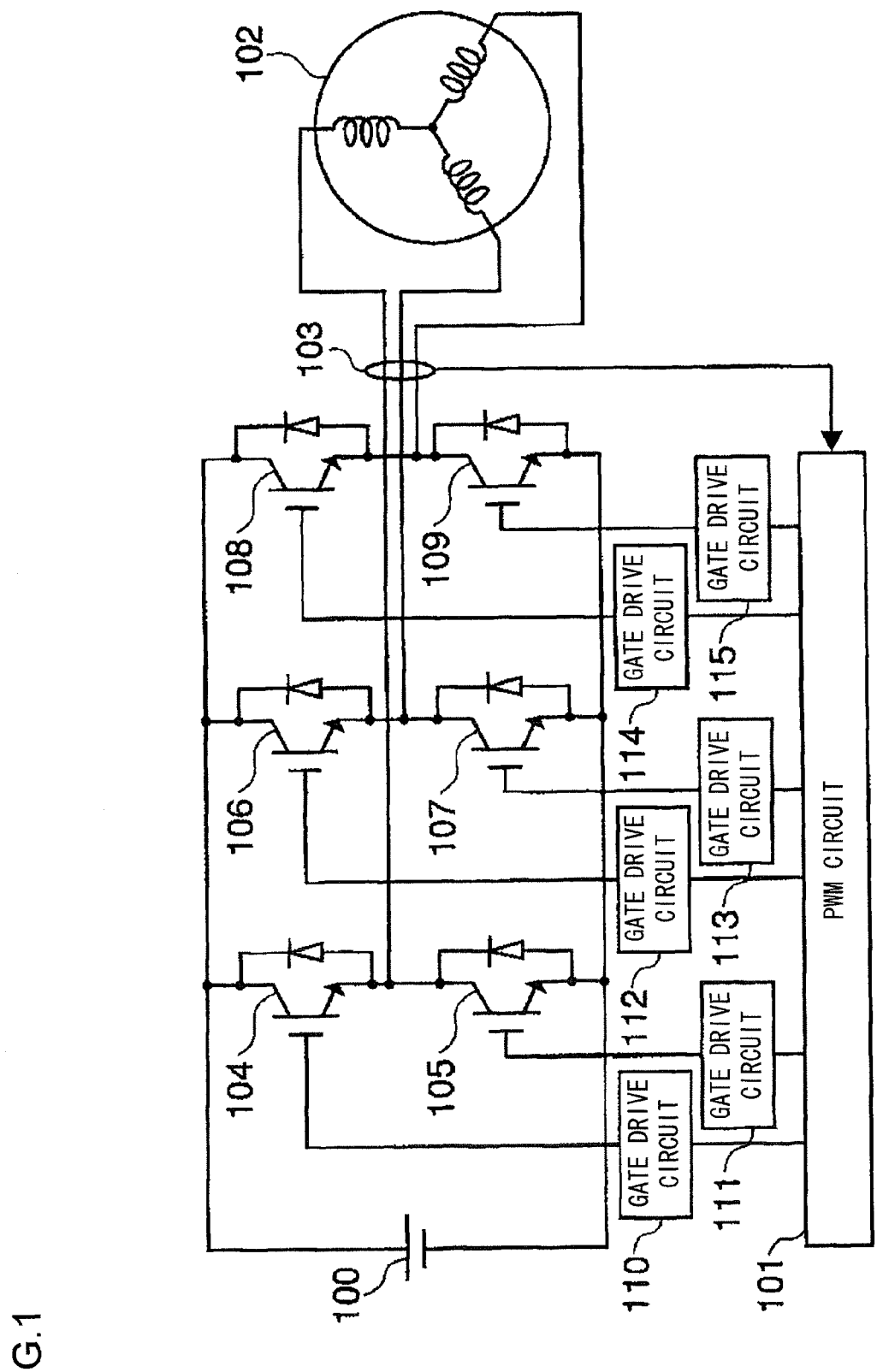
FIG. 1 is a circuit block diagram of a typical inverter for an HEV.

FIG. 1 is a circuit block diagram of a typical inverter system for an HEV. This inverter system includes: power semiconductor elements 104 through 109 that convert the DC voltage of a battery 100 into AC voltage; a motor 102; a current sensor 103 that detects the currents from the power semiconductor elements 104 through 109; a PWM circuit 101 that internally houses a CPU, a counter circuit, input and output circuits, and so on; and gate drive circuits 110 through 115 for driving the power semiconductor elements 104 through 109. Zener clamping circuits are included in the gate drive circuits described above. Here, a gate drive circuit is provided for each arm. It should be understood that, in this embodiment, the power semiconductor elements are generally IGBTs.

With the circuit structure shown in FIG. 1, the PWM circuit 101 performs PWM (pulse width modulation) calculation so as to reduce to zero the deviations between the current values outputted by the power semiconductor elements 104 through 109, as detected by the current sensor 103, and set values. PWM signals (pulse signals) in which ON signals and OFF signals to the power semiconductor elements 104 through 109 are alternately repeated are outputted from this PWM circuit 101 to the gate drive circuits 110 through 115.

Figure 2:
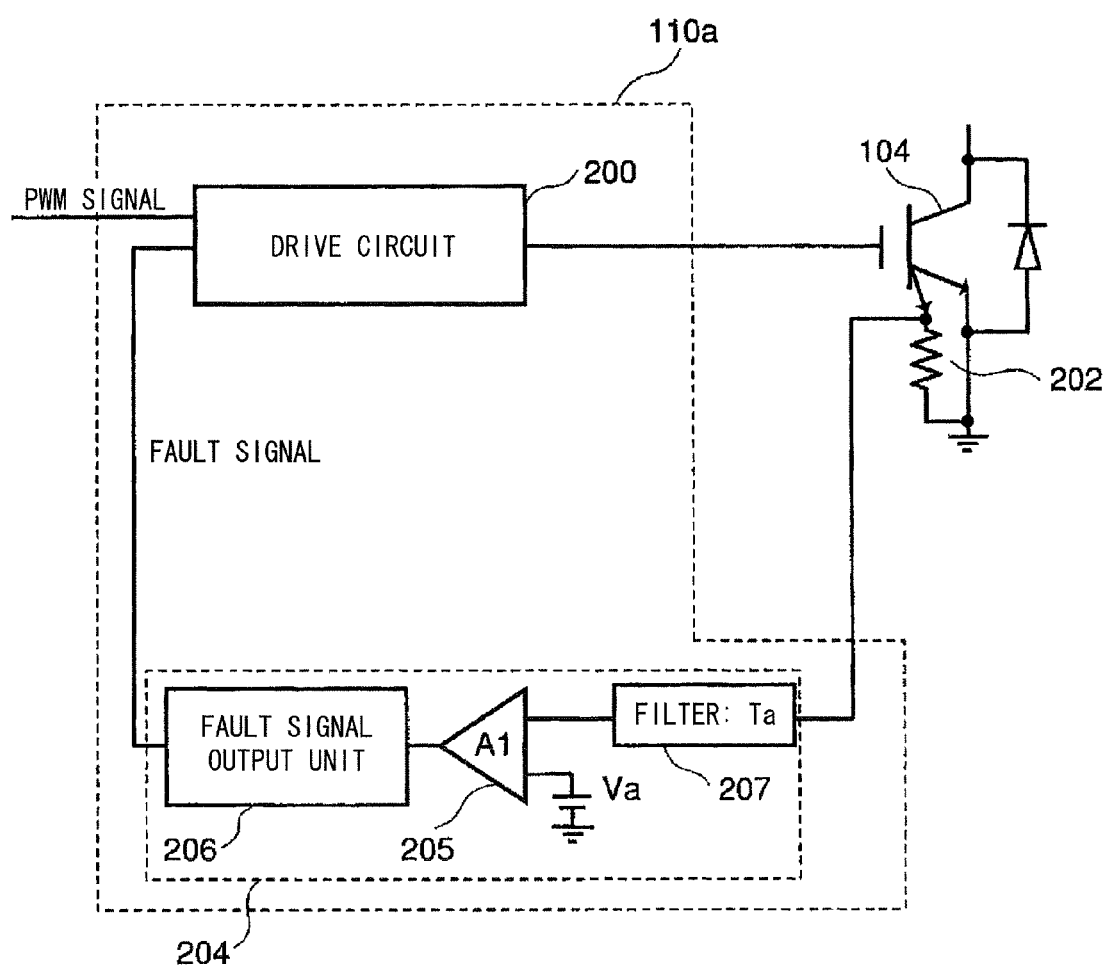
FIG. 2 is a circuit diagram showing, in concrete terms, the structure of a power semiconductor element and an over-current detection circuit that are used in a prior art inverter circuit.

FIG. 2 is a structural circuit diagram showing a prior art gate drive circuit 110a for driving the power semiconductor element 104. As shown in FIG. 2, by reading the voltage across a mirror emitter detection resistor 202 that is connected to a mirror emitter terminal of the power semiconductor element 104, an over-current protection circuit 204 of a gate drive circuit 110a such as is generally employed detects over-current anomaly of the power semiconductor element 104 and stops the operation of the power semiconductor element 104. If the mirror voltage read by the mirror emitter detection resistor 202, as received via a blanking filter 207 for eliminating recovery surge noise, is higher than an over-current detection reference voltage Va that is set by an over-current detection comparator 205, then this over-current protection circuit 204 decides that an over-current anomaly is present, and outputs a fault signal for stopping the output of the power semiconductor element 104 from a fault signal output unit 206.

Figure 8:
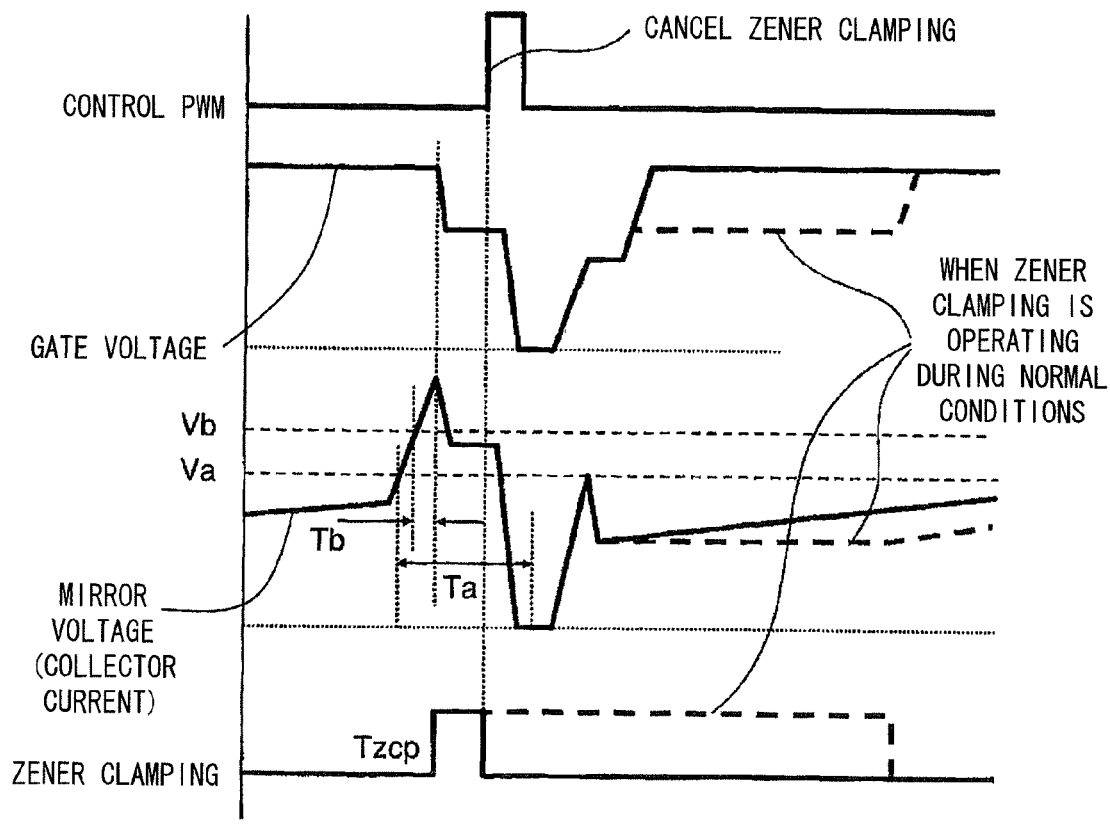
FIG. 8 is an example of a timing chart for a voltage waveform in the embodiment of the present invention (FIG. 7) when Zener clamping operation has been canceled over a short time interval.

It should be understood that control PWM signals are also included in the PWM signal of FIG. 2, these being control signals for turning the PWM control ON and OFF. Moreover, for explanation, a control PWM OFF signal for turning the PWM control OFF is shown in FIG. 8.

Figure 5:
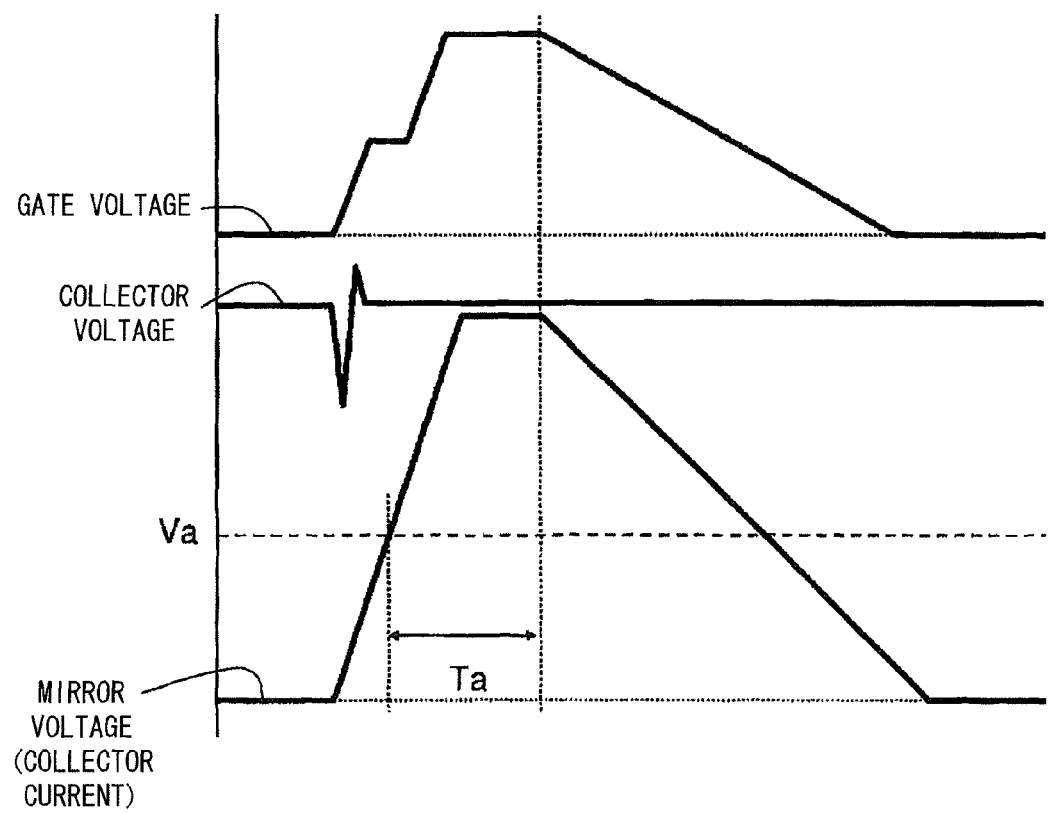
FIG. 5 is an example of a timing chart for a voltage waveform during switching operation of the power semiconductor element of the prior art circuit of FIG. 2.

A timing chart for over-current protection operation for the gate drive circuit 110a shown in FIG. 2 is shown in FIG. 5. The gate voltage, the collector voltage, and the mirror voltage (i.e. the collector current) shown along the vertical axis are voltage values of the power semiconductor element 104. And Va is the over-current detection reference voltage Va explained with reference to FIG. 2.

With this prior art gate drive circuit, if an over-current condition occurs, such as arm short circuiting between the power semiconductor element 104 shown in FIG. 1 and the power semiconductor element 105, then, since operation of the power semiconductor element 104 is not stopped during the blanking time interval Ta of the blanking filter 207, accordingly short circuiting operation in the control voltage of the drive circuit 200 continues until the operation of the power semiconductor element 104 is stopped by the over-current protection anomaly, and this is undesirable.

Due to this, if an IGBT or the like whose toleration for short circuiting is low is employed as the power semiconductor element 104, then there is a fear that it is not possible to ensure a sufficient operational margin for safety, since it is not possible to set the blanking time interval Ta freely.

Figure 3:
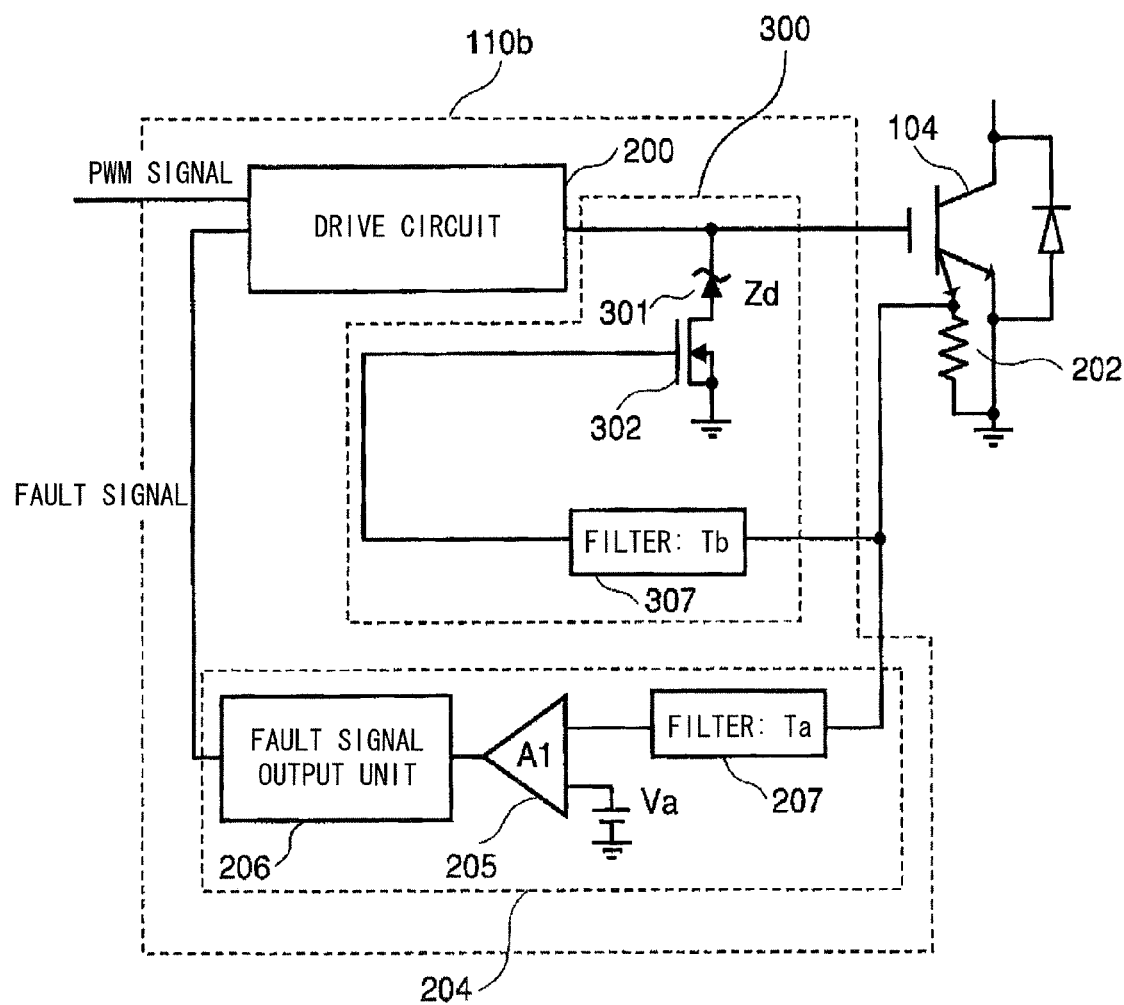
FIG. 3 is a circuit diagram showing, in concrete terms, the structure of a power semiconductor element, an over-current detection circuit, and a Zener clamping protection circuit that are used in a prior art inverter circuit.

FIG. 3 is a structural circuit diagram of a gate drive circuit 110b in which a Zener clamping protection circuit 300 is added to the gate drive circuit 110a of FIG. 2. This Zener clamping protection circuit 300 comprises a Zener diode 301 for clamping the gate voltage of the power semiconductor element 104, a MOSFET 302 for Zener clamping in order to make this Zener diode 301 go conductive, and a blanking filter 307 for Zener clamping detection protection. In this circuit structure, a mirror emitter detection resistor 202 is connected to the gate terminal of the MOSFET 302, in a similar manner to the case with the over-current protection circuit 204, and Zener clamping operates by the mirror voltage exceeding the threshold voltage of the MOSFET 302 via a blanking filter 307. By the gate drive circuit 110b of FIG. 3 performing Zener clamping operation, the gate voltage of the power semiconductor element 104 is clamped during the interval until the short circuiting anomaly stops, so that it is possible to reduce the short circuiting energy.

Figure 6:
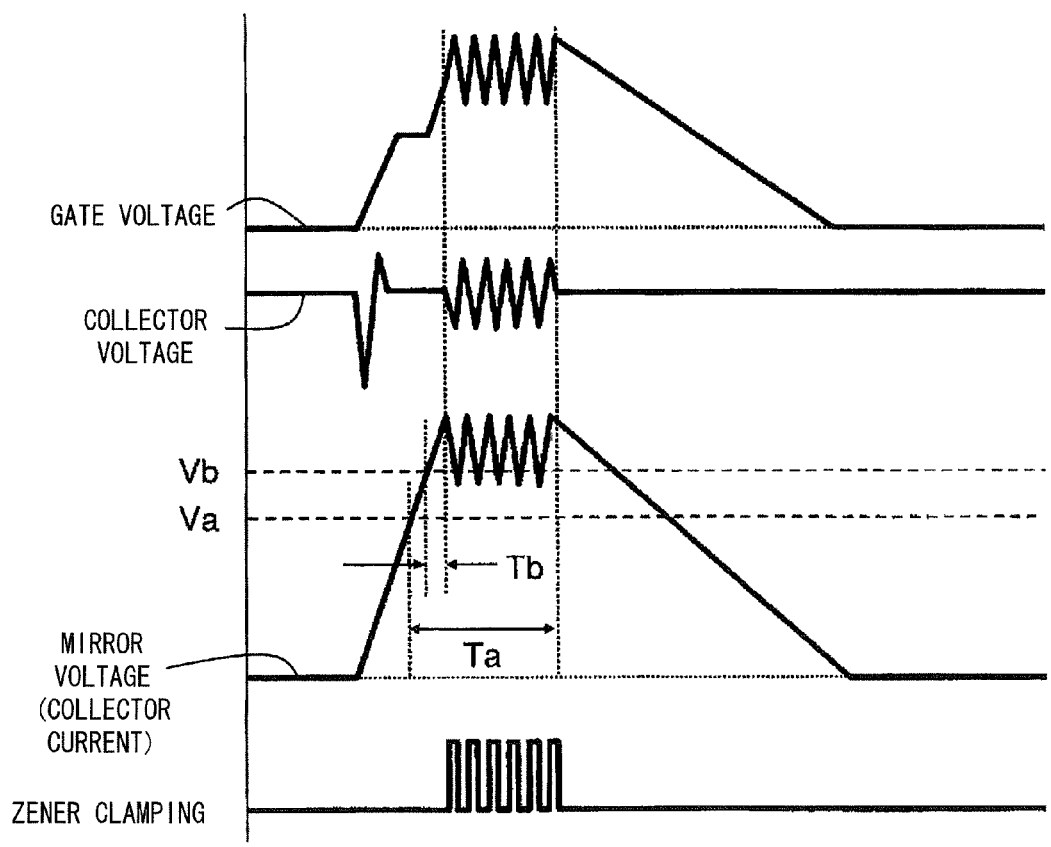
FIG. 6 is an example of a timing chart for a voltage waveform during switching operation of the power semiconductor element of the prior art circuit of FIG. 3.

However, depending upon the characteristics of the power semiconductor 104 that is employed, the input voltage of the power semiconductor element 104 may oscillate due to the repeated operations of Zener clamping and cancellation thereof, and there is a fear that the output voltage and the output current may become unstable, and this would be undesirable. FIG. 6 is a figure showing a timing chart for such unstable operation.

The gate voltage, the collector voltage, and the mirror voltage (i.e. the collector current) shown along the vertical axis are voltage values of the power semiconductor element 104. And the Zener clamping shows the switching timing of the MOSFET 302 on the vertical axis. Moreover, Vb is a detection reference voltage of a Zener clamping detection comparator of the Zener clamping protection circuit 300 shown in FIG. 3. And Tb is the blanking time interval of the blanking filter 307.

Figure 4:
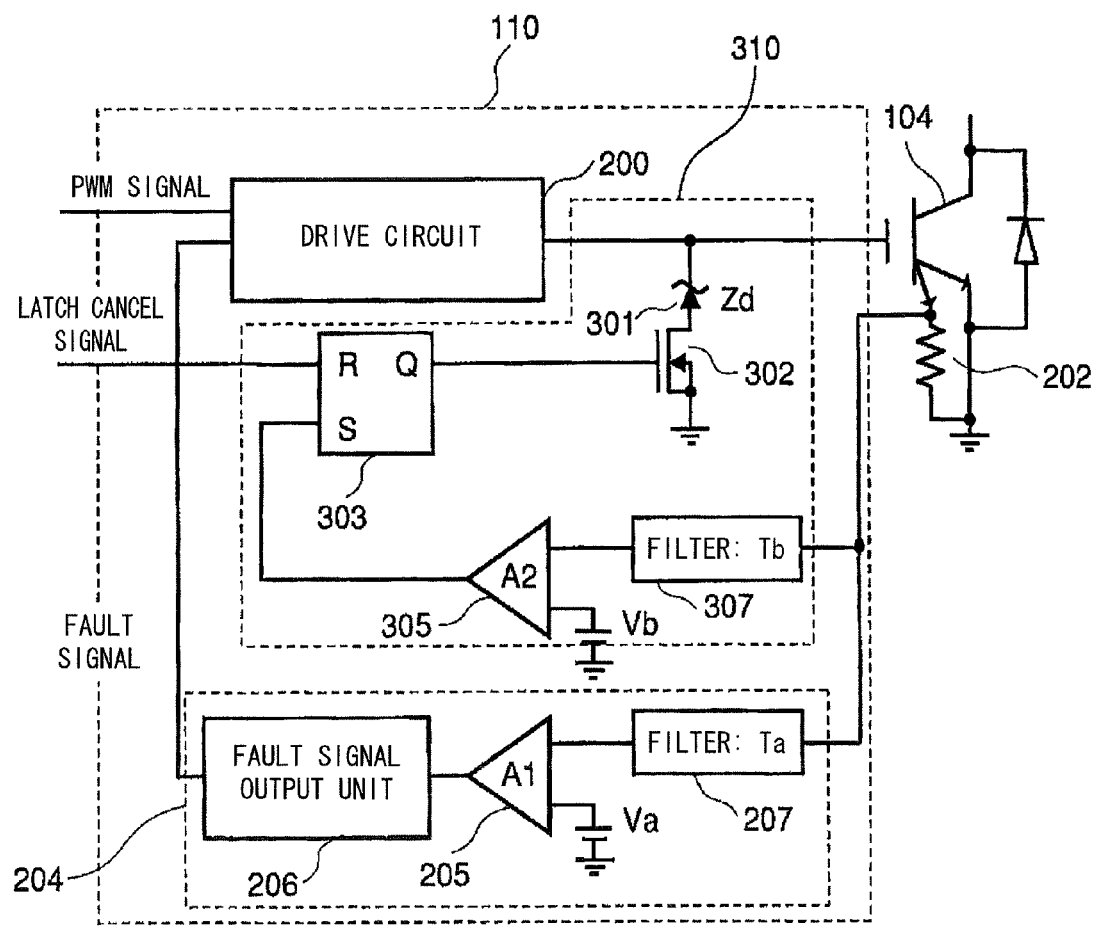
FIG. 4 is a circuit diagram showing, in concrete terms, the structure of a power semiconductor element, an over-current detection circuit, and a Zener clamping protection circuit according to an embodiment of the present invention.

FIG. 4 is a structural circuit diagram for a gate drive circuit 110 according to an embodiment of the present invention. In FIG. 4, a Zener clamping protection circuit 310 detects the voltage across the mirror emitter detection resistor 202 in a similar manner to the case with the over-current protection circuit 204, and performs Zener clamping operation when the voltage detected via a blanking filter 307 for Zener clamping protection detection for eliminating surge noise of steady recovery is higher than a predetermined Zener clamping detection reference voltage Vb that is set by a comparator 305 for Zener clamping detection.

In other words, the over-current protection circuit 204 detects the voltage on the emitter electrode side of the power semiconductor element 104, compares this voltage value with an over-current detection reference voltage Va (a first predetermined voltage value), and, on the basis of the result of this comparison, outputs a fault signal from the fault signal output unit 206 for stopping the output of the gate voltage signal to the drive circuit 200. On the other hand, the Zener clamping protection circuit 310 detects the voltage on the emitter electrode side of the power semiconductor element 104, compares this voltage value with the detection reference voltage Vb (a second predetermined voltage value), and clamps the gate voltage signal of the drive circuit 200 on the basis of the result of this comparison. Moreover, with the output of this Zener clamping signal, it is possible to eliminate the bad effect of the input voltage of the power semiconductor element 104 oscillating or the like by using the latch circuit 303, since the Zener clamping operation continues for a fixed interval irrespective of the behavior of the mirror voltage after the Zener clamping operation.

Figure 7:
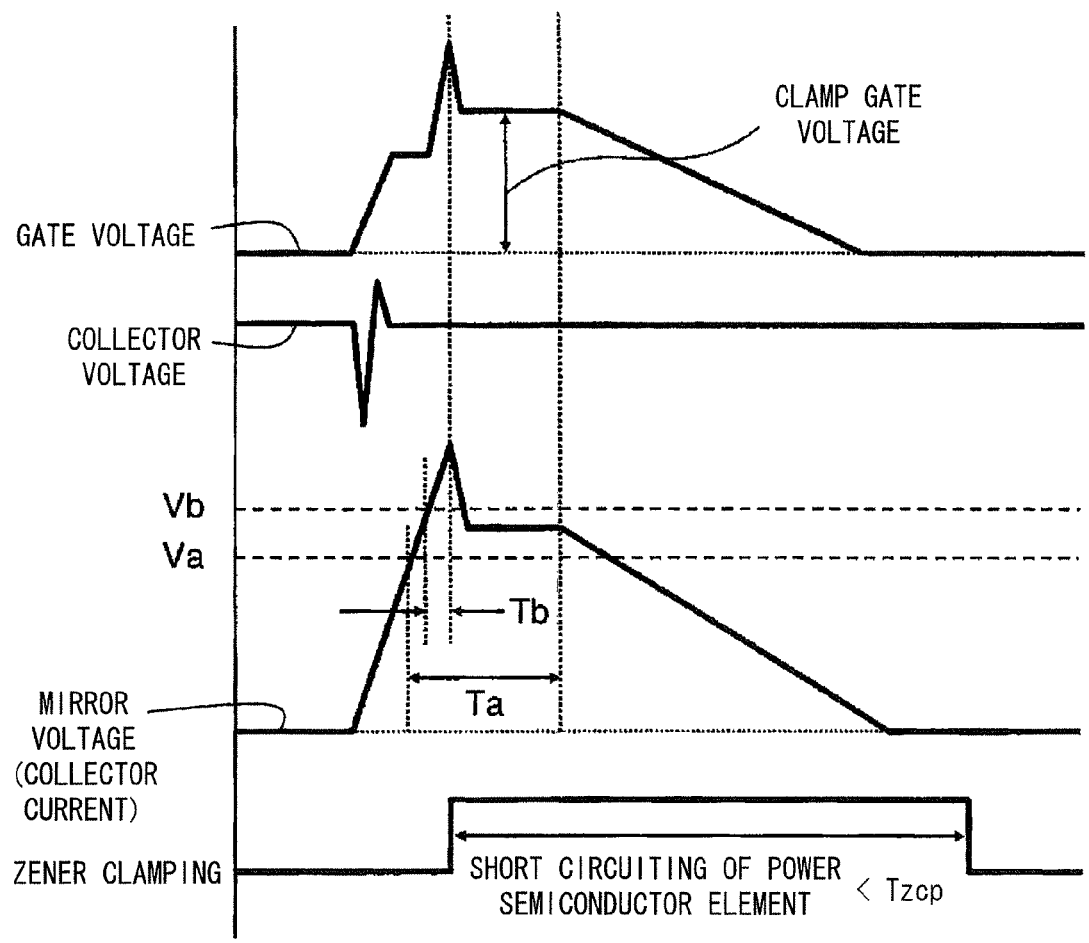
FIG. 7 is an example of a timing chart for a voltage waveform during switching operation of the power semiconductor element of the embodiment of the present invention of FIG. 4.

A timing chart for the over-current protection circuit 204 and the Zener clamping protection circuit 310 of FIG. 4 is shown in FIG. 7. Here, the blanking time interval of the blanking filter 207 for over-current detection is termed Ta, the detection reference voltage of the comparator 205 for over-current detection is termed Va, the blanking time interval of the blanking filter 307 for Zener clamping detection is termed Tb, and the detection reference voltage of the comparator 305 for Zener clamping detection is termed Vb.

As the distinguishing characteristic of the inverter drive device of this embodiment, the blanking time interval Tb for Zener clamping detection is set to be as short as possible, since it is necessary to respond at high speed when short circuiting of the inverter circuit occurs. However, it should be set to be longer than the width of the recovery noise that is generated during steady operation.

Moreover, by setting the detection reference voltage Vb that is the threshold value for Zener clamping to be higher than the detection reference voltage Va that is the threshold value for over-current protection, it is arranged for the Zener clamping to work when an anomaly occurs in which the current value is high and also the frequency is low, such as arm short circuiting. This is in order to prevent the Zener clamping from operating when over-current state occurs that is not as great as the current during short circuiting of the inverter circuit, so that the output current of the power semiconductor element 104 is prevented from being undesirably limited.

The time interval Tzcp for outputting the Zener clamping is set to be longer than the blanking time interval Ta. This is in order to prevent the Zener clamping from ending during the interval after over-current is detected and the blanking time interval elapses until stopping, in which case the short-circuit current would increase for a second time.

In concrete terms, the time interval Tzcp for outputting the Zener clamping is set to be of the same order as the short circuiting toleration time interval of the power semiconductor element 104, in order for the over-current protection using Va to be ended within the short circuiting toleration time interval of the IGBT.

Due to this, it becomes possible to clamp the input voltage of the power semiconductor element 104 in a steady manner, so that it becomes possible to reduce the short circuiting energy.

FIG. 8 is a first timing chart showing the output timing of the reset signal of the latch circuit 303. The reset signal trigger for the latch circuit 303 that generates the Zener clamping time interval (i.e. the latch cancel signal in FIG. 4) is inputted in synchronism with the control PWM signal that is inputted to the drive circuit 200 going to OFF. It should be understood that, in FIG. 8, the synchronizing circuit is omitted.

This type of control is performed in order to avoid a situation in which Zener clamping continues to operate when next the control PWM signal goes to ON, if the Zener clamping output time interval Tzcp is greater than the minimum OFF width of the PWM signal inputted to the drive circuit 200.

Figure 9:
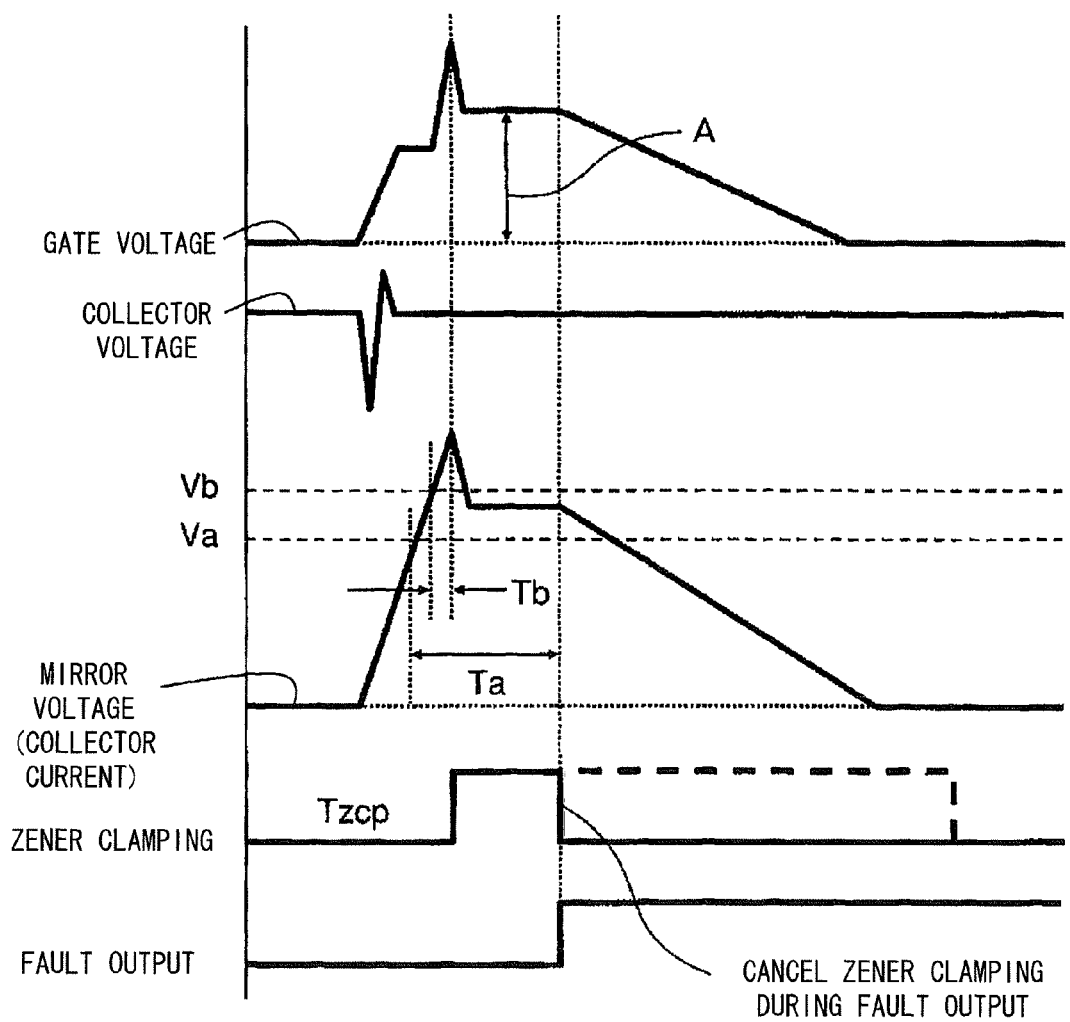
FIG. 9 is an example of a timing chart for a voltage waveform in the embodiment of the present invention (FIG. 7) when Zener clamping operation has been canceled during fault output.

FIG. 9 is a second timing chart showing the output timing of the reset signal of the latch circuit 303. The end timing of the output time interval Tzcp, in other words the reset signal trigger for the latch circuit 303 that generates the Zener clamping time interval, is inputted in synchronism with the timing at which the fault signal that is outputted from the fault signal output unit 206 goes to ON. Or, alternatively, it would also be acceptable for the end timing of the output time interval Tzcp to be synchronized with a signal that specifies that another anomaly of the inverter circuit has been detected.

When an anomalous state of the inverter circuit has been detected, the drive circuit 200 lowers the gate voltage in a soft intercepted state (after the time point A in FIG. 9) for a longer time interval than the time interval that the gate voltage is turned OFF during normal control of the gate voltage. Since, in this case, there is no requirement for Zener clamping, accordingly the latch operation for Zener clamping is terminated.

Figure 10:
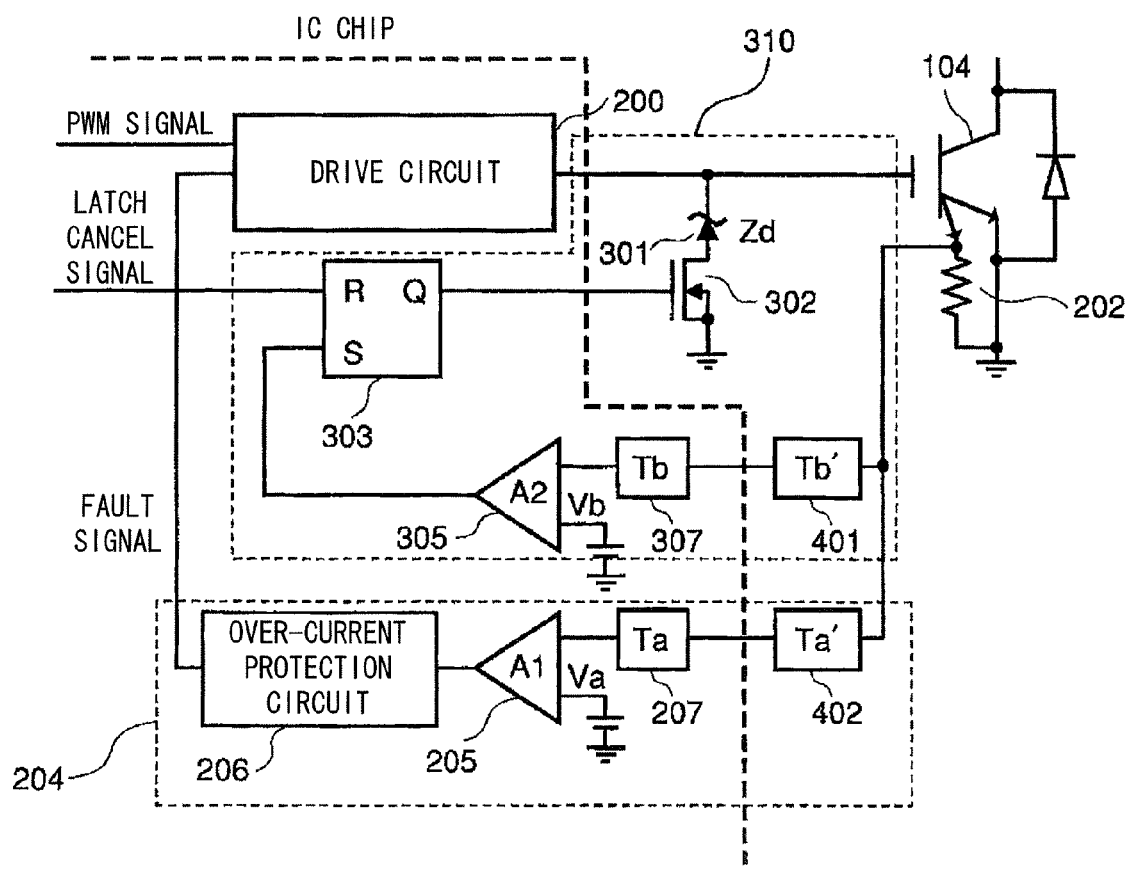
FIG. 10 is an circuit diagram of an inverter in which, according to an embodiment of the present invention, an over-current detection time interval and a Zener clamping operation time interval can be provided separately.

FIG. 10 is a first structural circuit diagram showing a case when the inverter drive device of this embodiment is only partially made as ICs. Since the Zener clamping current flows to the Zener diode 301 and the MOSFET 302 for a long time interval, accordingly heat is generated. Therefore, the over-current protection circuit 204 and the Zener clamping protection circuit 310 are built as ICs, while not including the Zener diode 301 and the MOSFET 302 therein. Moreover it is also possible to provide additional individual adjustment, since a filter Tb' 401 and a filter Ta' 402 are provided exterior to the IC circuits.

Figure 11:
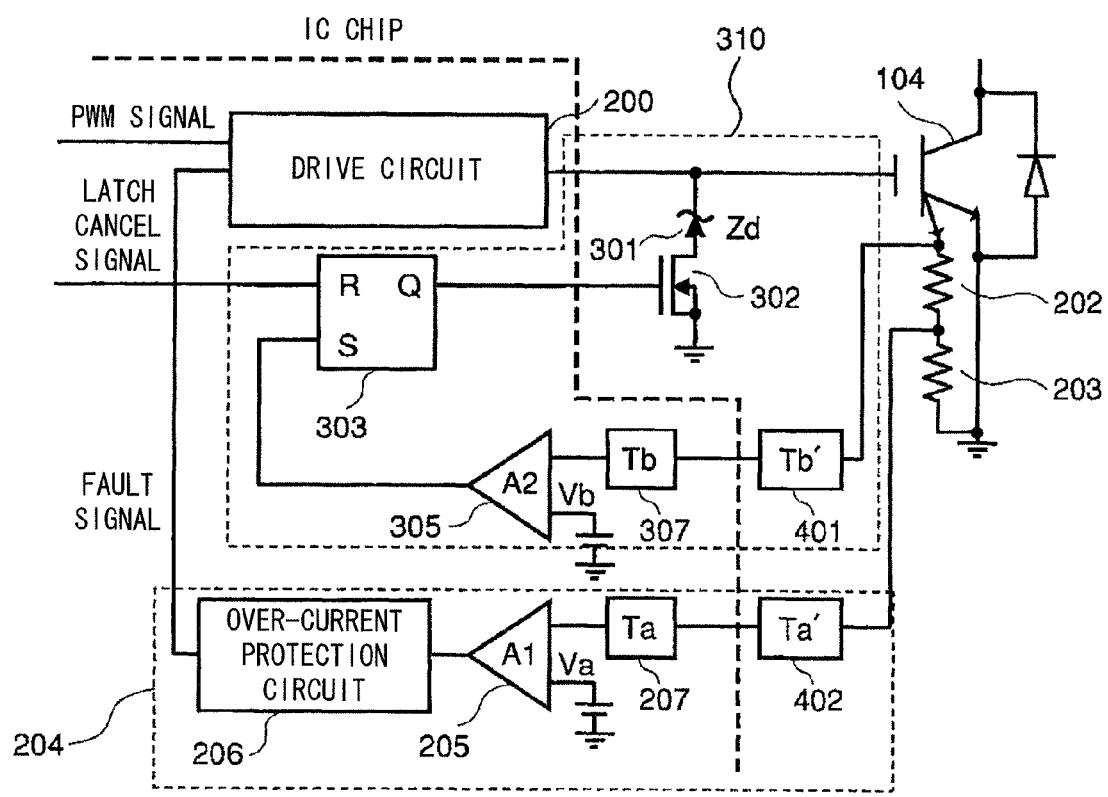
FIG. 11 is an circuit diagram of an inverter in which, according to an embodiment of the present invention, an over-current detection level and a Zener clamping detection level can be set separately.

FIG. 11 is a second structural circuit diagram showing a case when the inverter drive device of this embodiment is only partially made as ICs. With this structure in which the mirror emitter detection resistor 202 and the mirror emitter detection resistor 203 are provided separately, it becomes possible to adjust individually the voltages for the over-current detection level and the Zener clamping detection level inputted to each of them. However, the over-current detection level should be set to be lower than the Zener clamping detection level.

It should be understood that the present invention is not to be considered as being limited to the embodiments and variant embodiments described above, provided that its essential characteristics are preserved.

The content of the disclosure of the following priority application is incorporated herein by reference:

Japanese Patent Application 2011-121215 (filed on 31 May 2011).

The invention claimed is:

1. An inverter drive device that drives an inverter circuit including a power semiconductor element, comprising:
   a drive circuit that outputs a gate voltage of the power semiconductor element on the basis of a PWM signal;
   an over-current protection circuit that acquires an emitter electrode side voltage of the power semiconductor element, and, if that voltage is greater than a first predetermined voltage value that is determined in advance, outputs a fault signal to the drive circuit for stopping the output of the gate voltage after a first predetermined time interval has elapsed from the acquisition of the emitter electrode side voltage; and
   a Zener clamping protection circuit that acquires the emitter electrode side voltage of the power semiconductor element, and, if that voltage is greater than a second predetermined voltage value that is determined in advance, performs clamping of the gate voltage of the drive circuit after a second predetermined time interval has elapsed from the acquisition of the emitter electrode side voltage; wherein
   the Zener clamping protection circuit comprises a latch circuit that, after the emitter electrode side voltage has been acquired, continues the clamping of the gate voltage by the Zener clamping protection circuit during an interval that is greater than the first predetermined time interval.

2. An inverter drive device according to claim 1, wherein the second predetermined voltage value is set to be greater than the first predetermined voltage value.

3. An inverter drive device according to claim 1, wherein the second predetermined time interval is set to be smaller than the first predetermined time interval.

4. An inverter drive device according to claim 1, wherein the latch circuit sets the clamp continuation time interval to be longer than a short circuit toleration time interval of the power semiconductor element.

5. An inverter drive device according to claim 1, wherein the latch circuit performs cancellation of clamping of the gate voltage by the Zener clamping protection circuit in synchronism with the OFF signal of the PWM signal that is inputted to the drive circuit.

6. An inverter drive device according to claim 1, wherein the latch circuit performs cancellation of clamping of the gate voltage by the Zener clamping protection circuit in synchronism with the fault signal that is inputted to the drive circuit.

* * * * *